(12) United States Patent
Pan et al.

(10) Patent No.: US 10,324,551 B2
(45) Date of Patent: Jun. 18, 2019

(54) TOUCH-CONTROL DISPLAY DEVICE

(71) Applicants:Xiamen Tianma Micro-electronics Co., Ltd., Xiamen (CN); Tianma Micro-electronics Co., Ltd., Shenzhen (CN)

(72) Inventors: Chaohuang Pan, Xiamen (CN); Poping Shen, Xiamen (CN); Zhonghuai Chen, Xiamen (CN); Sichao Ke, Xiamen (CN); Yumin Xu, Xiamen (CN); Zhijian Zhang, Xiamen (CN); Ting Zhou, Xiamen (CN); Jiaqi Kang, Xiamen (CN); Yingzhang Qiu, Xiamen (CN); Shaoting Lin, Xiamen (CN); Yuping Ma, Xiamen (CN)

(73) Assignees: Xiamen Tianma Micro-electronics Co., Ltd., Xiamen (CN); Tianma Micro-electronics Co., Ltd., Shenzhen (CN)

( * ) Notice: Subject to any disclaimer, the term of this patent is extended or adjusted under 35 U.S.C. 154(b) by 0 days.

(21) Appl. No.: 15/139,436

(22) Filed: Apr. 27, 2016

(65) Prior Publication Data
US 2017/0192565 A1    Jul. 6, 2017

(30) Foreign Application Priority Data

Dec. 31, 2015  (CN) .......................... 2015 1 1027593

(51) Int. Cl.
*G06F 3/041*    (2006.01)
*F21V 8/00*    (2006.01)
(Continued)

(52) U.S. Cl.
CPC .......... *G06F 3/0412* (2013.01); *G02B 6/0091* (2013.01); *G02F 1/13338* (2013.01); *G06F 3/044* (2013.01); *G06F 3/0414* (2013.01); *G06F 3/0416* (2013.01); *H05K 1/147* (2013.01); *G02F 1/134309* (2013.01); *G02F 2201/121* (2013.01); *H05K 2201/10128* (2013.01)

(58) Field of Classification Search
None
See application file for complete search history.

(56) References Cited

U.S. PATENT DOCUMENTS 8,382,361 B2 * 2/2013 Park ...................... G02B 6/009
174/254
2006/0114694 A1 * 6/2006 Cho ...................... G02B 6/0083
362/631
(Continued)

*Primary Examiner* — Lunyi Lao
*Assistant Examiner* — Benjamin X Casarez
(74) *Attorney, Agent, or Firm* — Anova Law Group, PLLC

(57) ABSTRACT

A touch-control display device includes a driving module, a display panel having a first force touch-control component and a self-capacitance type touch control-electrode, and a backlight module disposed with the display panel and having a second force touch-control component, with a variable gap formed between the first force touch-control component and the second force touch-control component. The first touch-control component comprises a plurality of first electrodes arranged in a matrix. The second force touch-control component is an electrical conductive layer. The self-capacitance type touch-control electrode comprises a plurality of second electrodes arranged in a matrix.

15 Claims, 14 Drawing Sheets

(51) Int. Cl.
*G02F 1/1333* (2006.01)
*G06F 3/044* (2006.01)
*H05K 1/14* (2006.01)
*G02F 1/1343* (2006.01)

(56) References Cited

U.S. PATENT DOCUMENTS

| | | | | |
|---|---|---|---|---|
| 2006/0139271 A1* | 6/2006 | Okuda | | G02F 1/133308 345/88 |
| 2008/0204623 A1* | 8/2008 | Tanaka | | G02B 6/0021 349/58 |
| 2009/0219259 A1* | 9/2009 | Kwon | | G06F 3/041 345/173 |
| 2010/0060601 A1* | 3/2010 | Oohira | | G02F 1/133308 345/173 |
| 2010/0060816 A1* | 3/2010 | Fukai | | G02F 1/133615 349/58 |
| 2010/0110328 A1* | 5/2010 | Tatebayashi | | G02B 6/0091 349/58 |
| 2010/0118225 A1* | 5/2010 | Lee | | G02B 6/0068 349/58 |
| 2011/0211139 A1* | 9/2011 | Itoh | | G02F 1/13452 349/60 |
| 2012/0194759 A1* | 8/2012 | Shan | | G02B 6/0088 349/58 |
| 2013/0141664 A1* | 6/2013 | Toyoyama | | G02F 1/1333 349/59 |
| 2014/0092034 A1* | 4/2014 | Franklin | | G09F 13/0413 345/173 |
| 2014/0218334 A1* | 8/2014 | Shibata | | G06F 3/044 345/174 |
| 2016/0077270 A1* | 3/2016 | Komano | | G02B 6/0028 349/65 |
| 2016/0088133 A1* | 3/2016 | Kim | | G06F 1/1643 345/174 |
| 2016/0170543 A1* | 6/2016 | Kawamura | | G06F 3/03547 345/174 |
| 2016/0299598 A1* | 10/2016 | Yoon | | G06F 3/044 |
| 2016/0334917 A1* | 11/2016 | Shepelev | | G06F 3/0416 |
| 2016/0349907 A1* | 12/2016 | Kobayashi | | G09G 3/3655 |
| 2016/0370908 A1* | 12/2016 | Kim | | G06F 3/044 |
| 2017/0010704 A1* | 1/2017 | Chen | | G06F 3/0412 |
| 2017/0010728 A1* | 1/2017 | Kurasawa | | G06F 3/0414 |
| 2017/0060329 A1* | 3/2017 | Yoon | | G06F 3/0416 |
| 2017/0068376 A1* | 3/2017 | Kim | | G06F 3/0416 |
| 2017/0090674 A1* | 3/2017 | Meng | | G02F 1/13338 |
| 2017/0123540 A1* | 5/2017 | Shih | | G06F 3/0412 |
| 2017/0168230 A1* | 6/2017 | Byun | | G02B 6/0091 |
| 2017/0192579 A1* | 7/2017 | Kim | | G06F 3/0414 |
| 2017/0220174 A1* | 8/2017 | Kim | | G06F 3/0414 345/174 |
| 2017/0220175 A1* | 8/2017 | Kim | | G06F 3/0414 345/174 |
| 2017/0228068 A1* | 8/2017 | Pu | | G06F 3/044 |

* cited by examiner

TOUCH-CONTROL DISPLAY DEVICE

CROSS-REFERENCES TO RELATED APPLICATIONS

This application claims priority of Chinese Patent Application No. 201511027593.1, filed on Dec. 31, 2015, the entire contents of which are hereby incorporated by reference.

FIELD OF THE INVENTION

The present disclosure generally relates to the field of display technologies and, more particularly, relates to a display device with built-in self-capacitance touch-control structures and force touch-control components.

BACKGROUND

An integrated touch-control display device is a display device with location touch-control detection structures integrated inside the display device. An integrated touch-control display device has both display and location touch-control detection functions and, thus, is often easy for use and with good human-computer interaction experience. A terminal with an integrated touch-control display device is often thin, light, and highly integrated, thus widely favored by market.

With the development of touch-control technologies, a new type of touch-control technology, force touch-control technology, is gradually attracting attentions. Under external pressure forces, a force touch-control structure may generate different feedback information according to different magnitudes of the pressure forces, and thus provide versatile usage experiences. However, with existing technologies, a force touch-control structure is usually an external structure independent of a display device, and the fabrication process of a force touch-control device is usually complicated. Further, a terminal with such force touch-control device is usually thick and heavy.

The disclosed methods and structures are directed to solve one or more problems set forth above and other problems in the art.

BRIEF SUMMARY OF THE DISCLOSURE

One aspect of the present disclosure includes a touch-control display device. The touch-control display device includes a driving module, a display panel having a first force touch-control component and a self-capacitance type touch control-electrode, and a backlight module disposed with the display panel and having a second force touch-control component, with a variable gap formed between the first force touch-control component and the second force touch-control component. The first touch-control component comprises a plurality of first electrodes arranged in a matrix. The second force touch-control component is an electrical conductive layer. The self-capacitance type touch-control electrode comprises a plurality of second electrodes arranged in a matrix.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the disclosure, which are illustrated in the accompanying drawings. Wherever possible, the same reference numbers will be used throughout the drawings to refer to the same or like parts.

Figure 1:
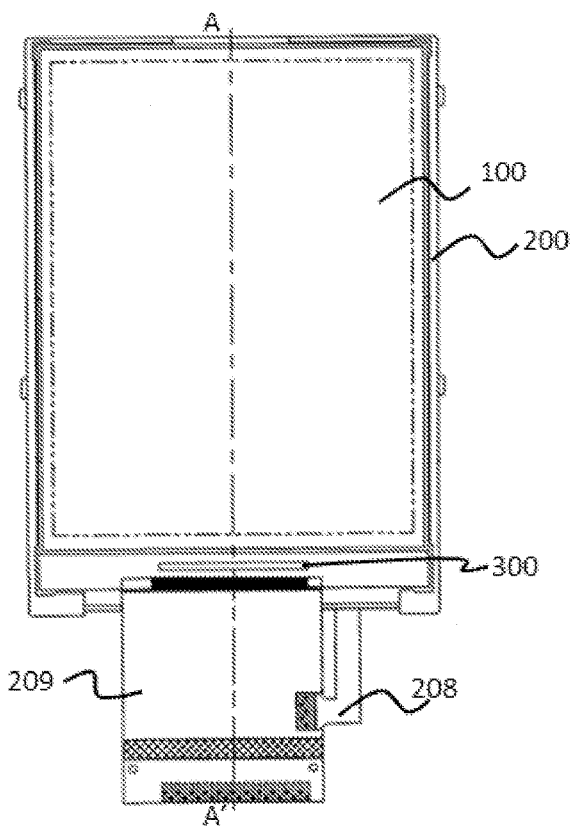
FIG. 1 illustrates a schematic view of an exemplary touch-control display device consistent with the disclosed embodiments.
Figure 2:
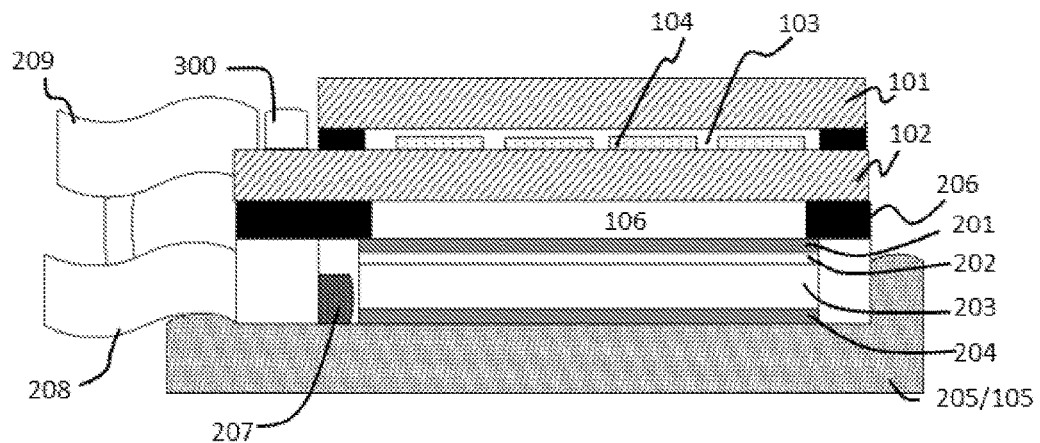
FIG. 2 illustrates a cross-sectional view along direction AA' in FIG. 1.

FIG. 1 illustrates a schematic view of an exemplary touch-control display device, and FIG. 2 illustrates a cross-sectional view along direction AA' in FIG. 1. As shown in FIG. 1 and FIG. 2, the touch-control display device comprises a display panel 100 and a backlight module 200. The backlight module 200 is disposed below the display panel 100, and provides a light source for the display panel 100. The display panel 100 may be a liquid crystal display panel, comprising a counter substrate 101 and an array substrate 102 that is oppositely disposed. A liquid crystal layer 103 is disposed between the counter substrate 101 and the array substrate 102.

The display device further comprises a first force touch-control component 104 and a second force touch-control component 105. As shown in FIG. 2, the first force touch-control component 104 is disposed between the counter substrate 101 and the array substrate 102. More specifically, the first force touch-control component 104 is disposed at the side of the array substrate 102 facing the counter substrate 101.

A backlight module 200 may comprise a plurality of film layers. As shown in FIG. 2, from the side close to the display panel 100 to the far side from the display panel 100, a brightness enhancement sheet 201, a diffusion sheet 202, a light guide plate 203, a reflection sheet 204, a metal frame 205, etc. are disposed in sequence. The second force touch-control component 105 may be disposed at the front surface or back surface of one of these film layers.

An electric conductive layer in these film layers may also be reused or multiplexed as a second force touch-control component. In FIG. 2, the second force touch-control component 105 and the metal frame 205 are a reused or multiplexed component. That is, the metal frame 205 may also serve as the second force touch-control component 105. Any conductive metal may be used as a material of the metal frame 205 (the second force touch-control component 105), such as aluminum alloy, copper alloy, and the like.

There is a variable gap 106 formed between the first force touch-control component 104 and the second force touch-control component 105. The magnitude of an external pressure force applied to the first force touch-control component 104 may be detected through the deformation of the variable gap 106.

Further, as shown in FIG. 1 and FIG. 2, a light-shading tape 206 is disposed at edges between the display panel 100 and the backlight module 200. The light-shading tape 206 may bind the display panel 100 and the backlight module 200 together, and may prevent the light leakage at the edges between the display panel 100 and the backlight module 200. As the light-shading tape 206 may have a certain thickness, the display panel 100, the backlight module 200, and the light-shading tape 206 may form a gap. This gap is the variable gap 106 between the first force touch-control component 104 and the second force touch-control component 105. Preferably, the thickness of the light shading tape 206 is in the range between 0.05 mm to 0.2 mm.

Figure 22:
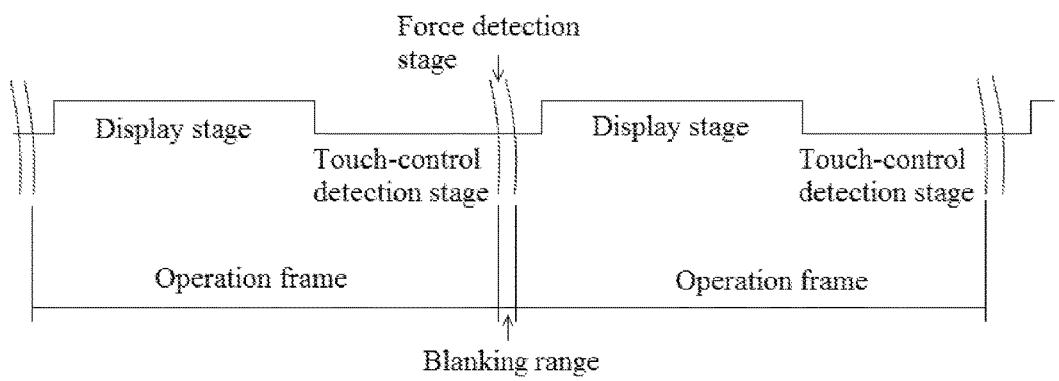
FIG. 22 illustrates an exemplary time-sharing approach consistent with the disclosed embodiments.

FIG. 22 illustrates an exemplary time-sharing approach for the operation of a touch-control display device. As shown in FIG. 22, the operation of a touch-control display device comprises a display stage, a touch-control detection stage, and a force detection stage. The force detection stage is at the blanking range between two operation frames of the touch-control display device.

In the display stage and the touch-control detection stage, the metal frame is set to a floating (high impedance, or Hi-Z) state to avoid affecting the quality of image display and touch-control detection. In the force detection stage, the metal frame is set to a ground state, and the metal frame is used as a reference ground in force detection.

Figure 3:
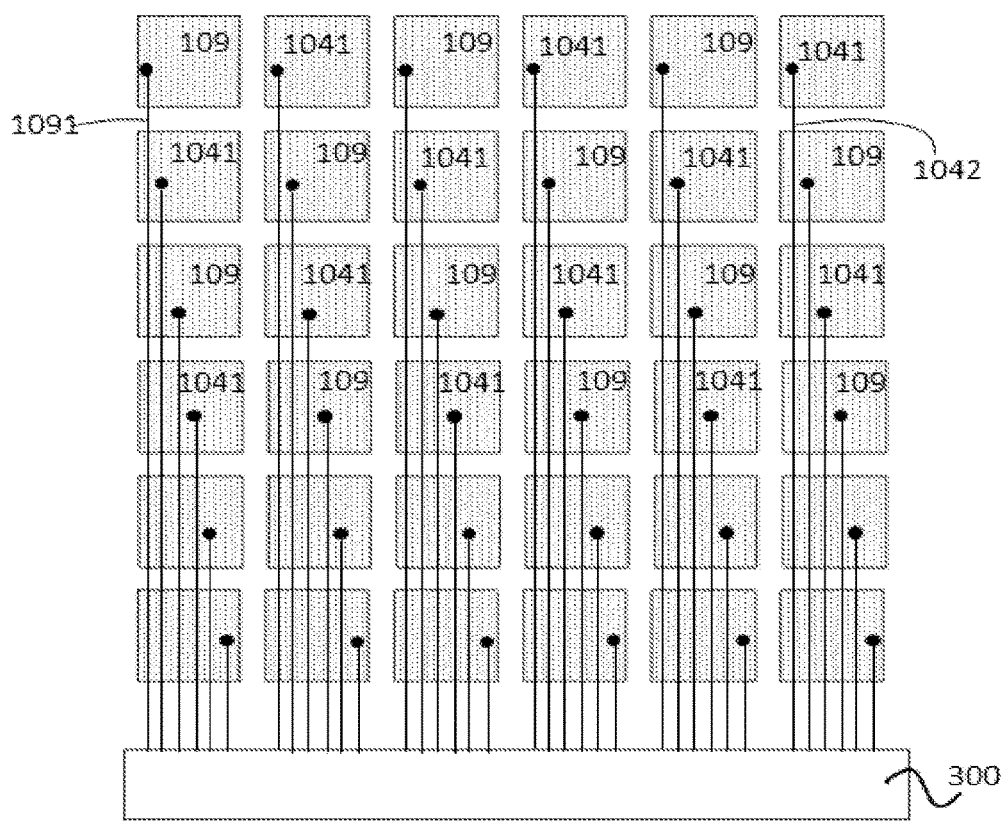
FIG. 3 illustrates a top view of an exemplary touch-control structure within a display device consistent with the disclosed embodiments.

As shown in FIG. 2 and FIG. 3, the first touch-control component 104 may comprise a plurality of first electrodes 1041 that are separated and arranged in a matrix. The plurality of first electrodes 1041 are connected to a driving module 300 respectively through their corresponding first conducting wires 1042. In a force detection stage, the driving module 300 provides a first force detection signal to the plurality of first electrodes 1041, and concurrently provides a second force detection signal to the second force touch-control component 105.

Figure 4:
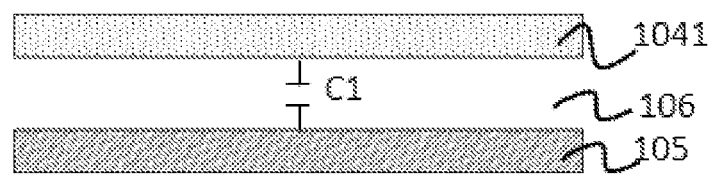
FIG. 4 illustrates an exemplary structure of a first electrode and a second force touch-control component with no external pressure forces applied, consistent with the disclosed embodiments.

As shown in FIG. 4, when no external pressure force is applied to a first electrode 1041 and a second force touch-control component 105, the variable gap 106 maintains its initial state. The first electrode 1041, the second force touch-control component 105, and the variable gap 106 form a capacitor C1.

Figure 5:
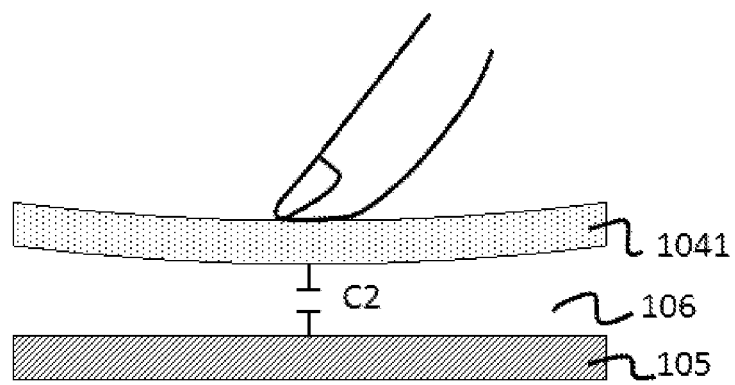
FIG. 5 illustrates an exemplary structure of a first electrode and a second force touch-control component applied with an external pressure force, consistent with the disclosed embodiments.

As shown in FIG. 5, when an external force is applied to the first electrode 1041 and the second force touch-control component 105, the variable gap 106 between the first electrode 1041 and the second force touch-control component 105 is compressed. The first electrode 1041, the second force touch-control component 105, and the variable gap 106 form a capacitor C2.

Based on the capacitance difference between the capacitor C2 and capacitor C1, the magnitude of the external pressure force may be calculated. Further, as the plurality of first electrodes 1041 are independent of each other, the external pressure force applied to each of the first electrodes 1041 may be separately calculated, and thus the location and magnitude of the external pressure force may be determined.

In the present embodiment, the second force detection signal may be a reference signal, and it may be a ground signal. That is, in a force detection stage, a driving module 300 may provide a ground signal to a metal frame.

Figure 6:
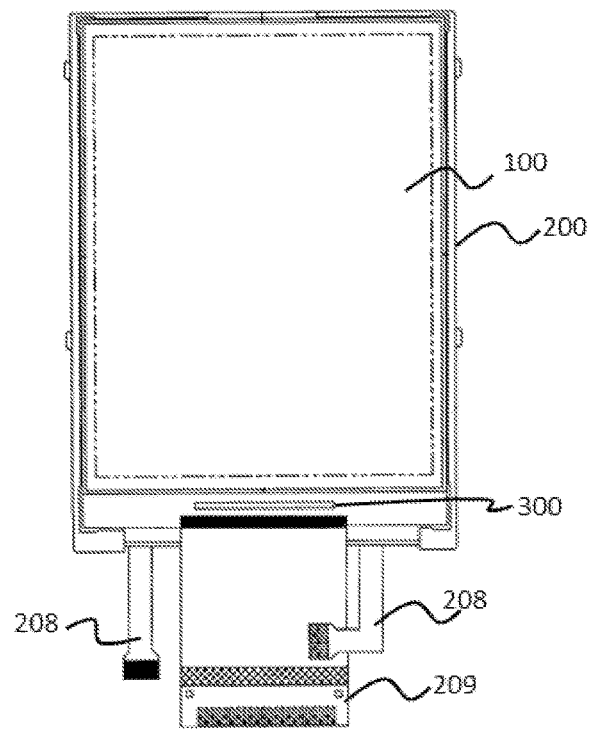
FIG. 6 illustrates a top view of an exemplary electrical connection between a metal frame and a driving module, consistent with the disclosed embodiments.
Figure 7:
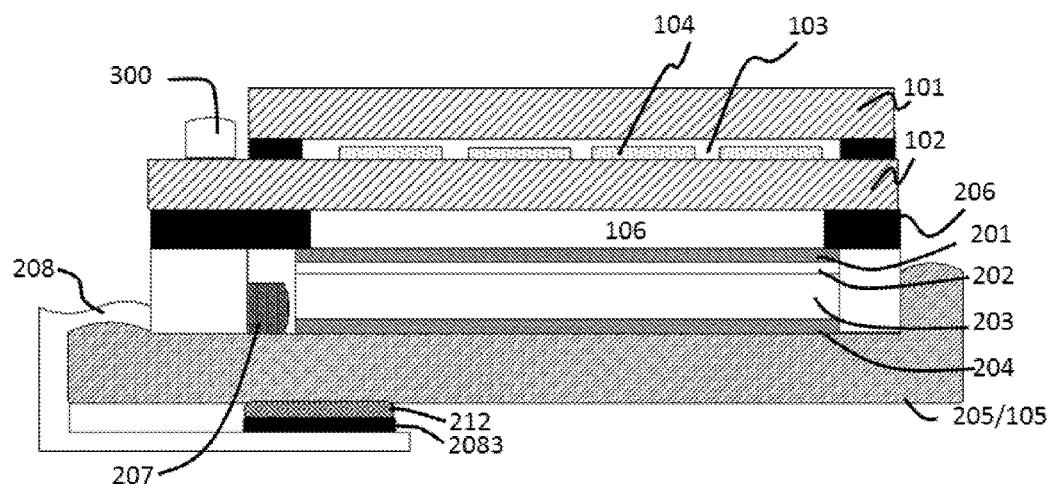
FIG. 7 illustrates an exemplary backlight FPC (flexible printed circuit) bending and connected to a side of a metal frame, consistent with the disclosed embodiments.
Figure 8:
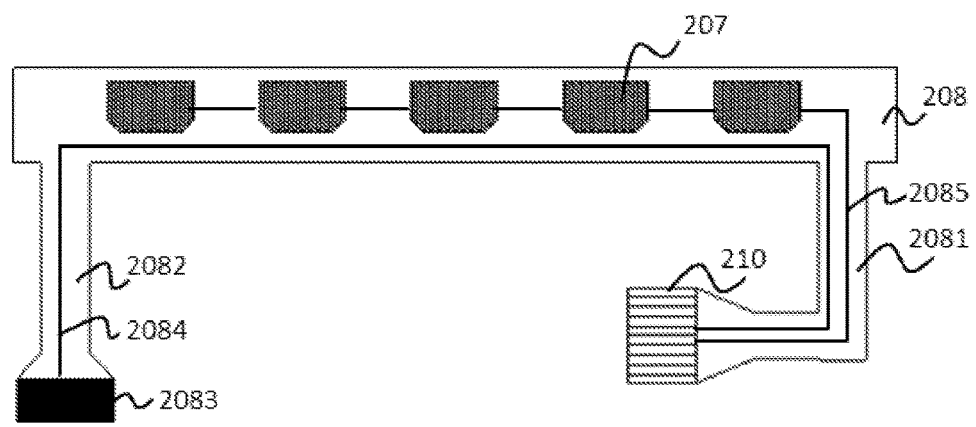
FIG. 8 illustrates a schematic view of an exemplary backlight FPC consistent with the disclosed embodiments.

FIG. 6 illustrates an exemplary electrical connection between a metal frame and a driving module. FIG. 7 illustrates a backlight FPC bending and connected to the metal frame. FIG. 8 illustrates a schematic view of the backlight FPC. The backlight module 200 comprises a plurality of LED lights 207, located at the light-emitting side of the light guide plate 203. The plurality of LED lights 207 are disposed on a backlight PFC 208. The backlight FPC 208 is electrically connected to a main FPC 209 through a lead pin 210 of a first connection terminal 2081. The LED lights 207 are connected to the lead pin 210 through a first conducting wire 2085. FIG. 8 shows only one first conducting wire 2085, and there may be a plurality of first conducting wires 2085.

The backlight FPC 208 further comprises a second connecting terminal 2082. The second connecting terminal 2082 departs away from the direction of the light guide plate 203 and protrudes outwardly. The second connecting terminal 2082 comprises an electrical conductive end 2083 disposed on the second connecting terminal 2082. A second conducting wire 2084 is disposed within the backlight FPC 208, and the second conducting wire 2084 connects the electrical conducting end 2083 and the lead pin 210. The lead pin 210 only needs to provide one signal port for the second conducting wire 2084 to be electrically connected to the main FPC 209.

The lead pin 210 is electrically connected to the main FPC 209 at the first connecting terminal 2081. The main FPC 209 is bound on the display panel 100 and electrically connected to the driving module 300. The second connecting terminal 2082 of the backlight FPC 208 is folded to the side of the metal frame 205 away from display panel 100. A conductive layer 212 is used to electrically connect the conducting end 2083 and the metal frame 205. That is, through the main FPC 209, the backlight FPC 208, the conductive end 2083, and the conductive layer 212, the signal of the driving module 300 may be provided to the metal frame 205.

Figure 9:
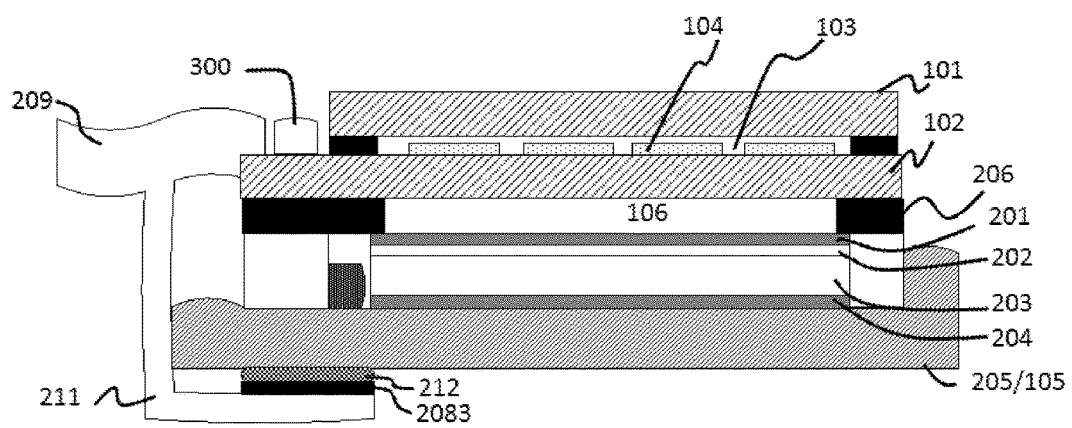
FIG. 9 illustrates another exemplary electrical connection between a metal frame and a driving module consistent with the disclosed embodiments.
Figure 10:
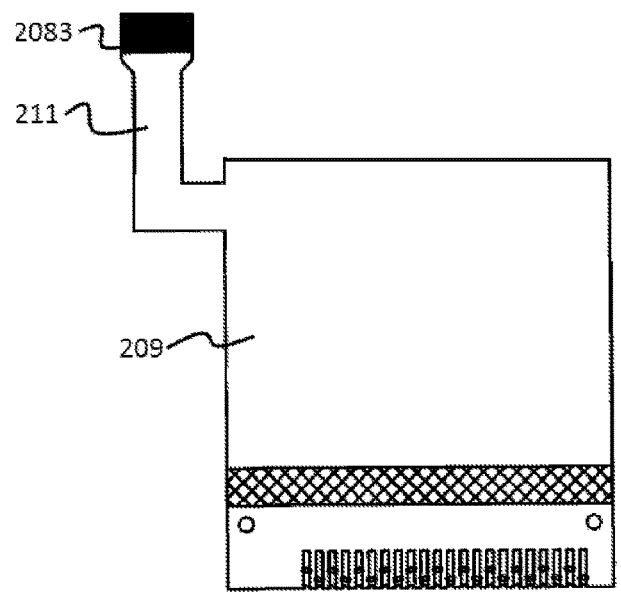
FIG. 10 illustrates an exemplary main FPC consistent with the disclosed embodiments.

FIG. 9 and FIG. 10 illustrate another exemplary electrical connection between a metal frame and a driving module. In the present configuration, the main FPC 209 comprises a connection terminal 211 that protrudes and extends to direction of the metal frame 205. An electrical conductive end 2083 is disposed at the connection terminal 211. The electrical conductive end 2083 is electrically connected to the metal frame 205 through a conductive adhesive layer 212.

Figure 11:
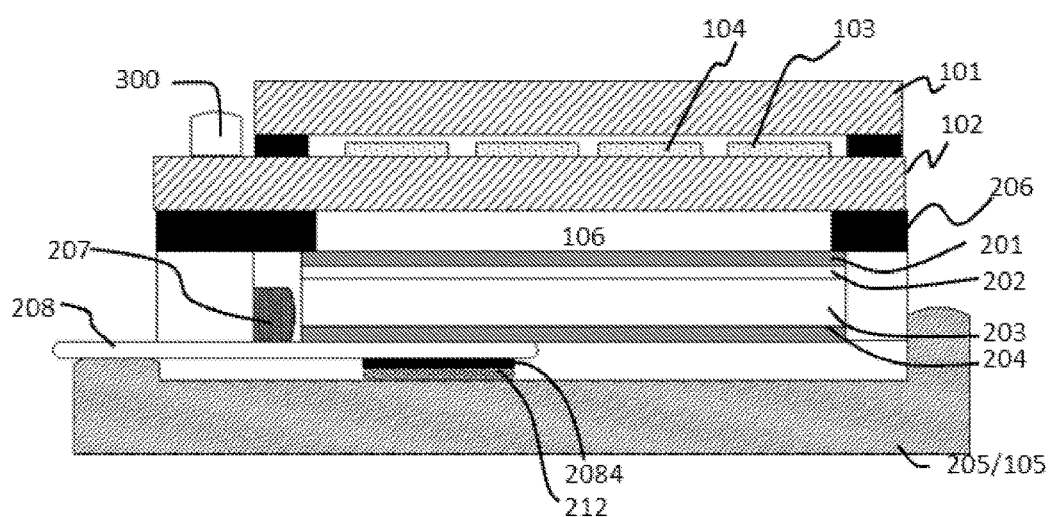
FIG. 11 illustrates another exemplary electrical connection between a metal frame and a driving module consistent with the disclosed embodiments.
Figure 12:
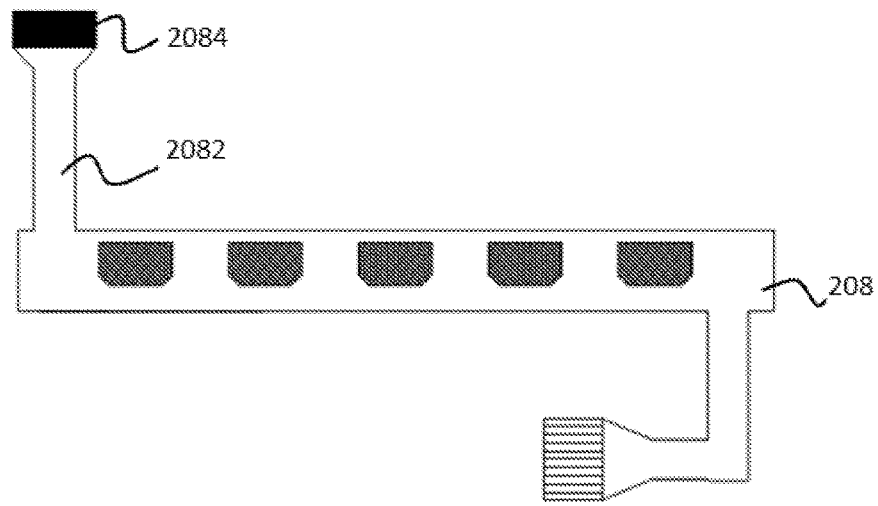
FIG. 12 illustrates another exemplary backlight FPC consistent with the disclosed embodiments.

FIG. 11 and FIG. 12 illustrate another exemplary electrical connection between a metal frame and a driving module. FIG. 11 illustrates the exemplary connection configuration, and FIG. 12 illustrates an exemplary backlight FPC. The backlight FPC 208 comprises a second connecting terminal 2082. The second connecting terminal 2082 extends into the space between the reflection sheet 204 and the metal frame 205. Further, the second connecting terminal 2082 is electrically connected to the metal frame 205 through the electrical conductive end 2084 disposed on the second connection terminal 2082, and the conductive adhesive layer 212 between the electrical conductive end 2084 and the metal frame 205.

Figure 13:
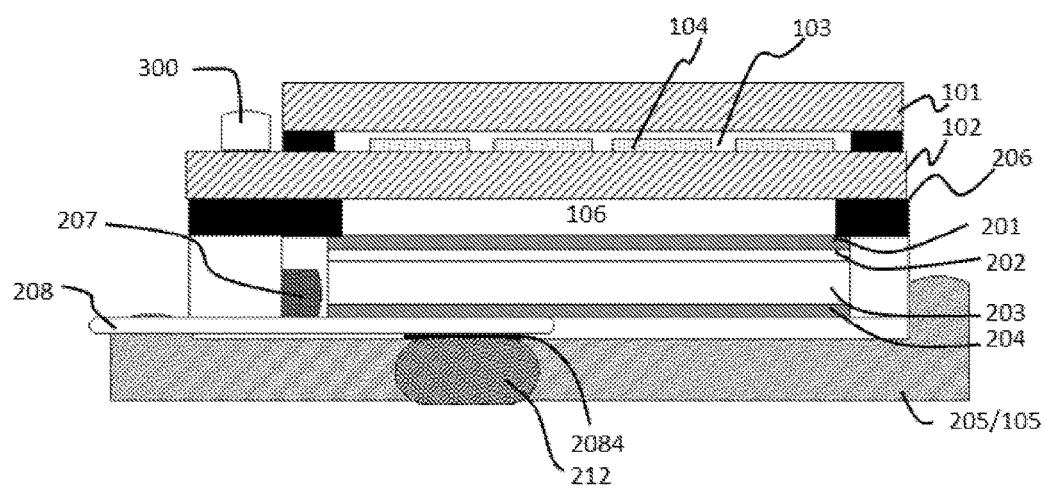
FIG. 13 illustrates another exemplary electrical connection between a metal frame and a driving module consistent with the disclosed embodiments.

FIG. 13 is illustrates another exemplary electrical connection between a metal frame and a driving module. A through hole is made in the metal frame 205, and the conductive adhesive layer 212 for connecting the electrical conductive end 2084 and the metal frame 205 is disposed in the through hole. In this way, the gap between the reflective sheet 204 and the metal frame 205 may be reduced, and the reflective sheet 204 may be significantly flat.

In some exemplary configurations, a connecting terminal may be disposed on the main FPC, and the connecting terminal extends into the space between the reflection sheet 204 and the metal frame 205. An electrical conductive end may be disposed on the connecting terminal. A conductive adhesive layer may be used to electrically connect the electrical conductive end on the main FPC and the metal frame.

The above configurations do not limit the methods for electrically connecting the metal frame and the driving module. The metal frame and the driving module may be electrically connected through other structures. It is within the protection scope of the present application as long as the signal of a metal frame is provided by a driving module.

As shown in FIG. 2 and FIG. 3, a self-capacitance type touch-control electrode is disposed between the counter substrate 101 and the array substrate 102. The self-capacitance type touch-control electrode comprises a plurality of second electrodes 109 arranged in a matrix. The plurality of second electrodes 109 are connected to the driving module 300 respectively through their corresponding second conducting wires 1091. Further, the plurality of second electrodes 109 of the self-capacitive type touch-control electrode and the plurality of first electrodes of the first force touch-control component 1041 are disposed on a same layer.

Each of the second electrodes 109 is respectively connected to the driving module 300 through a different second conducting wire 1091. When a touch occurs, the driving module 300 may locate the second electrode 109 that generates the touch signal according to the feedback signals from different second conducting wires 1091, and thus determine the location of touch occurrence.

In the touch-control detection stage, the driving module 300 provides a touch-control detection signal to the plurality of second electrodes 109, for detecting the location of touch occurrence. In the force detection stage, the driving module 300 provides a first force detection signal to the plurality of first electrodes 1041, and provides a second force detection signal to the second force touch-control component 105, for detecting whether there is an area, corresponding to a first electrode 1041, which is compressed by a pressure force, and determining the magnitude of the pressure force.

The disclosed touch-control display device may have following advantages. First, the force touch-control components and the self-capacitance type touch-control electrodes are integrated within the display device. Thus, the display device concurrently has a location detection function and a force detection function. Further, the first force touch-control components and the self-capacitance type touch-control electrodes are integrated in a same layer, and the second force touch-control components and the metal frame of the backlight module are integrated in a same layer. Therefore, the display device has a high integration, a small size, a light weight and a thin thickness. Second, the plurality of first electrodes of the first force touch-control component and the plurality of second electrodes of the self-capacitance type touch-control electrodes are disposed in a same layer. Therefore the first electrodes and the second electrodes may be formed in a same process step, and so the manufacturing process is simple. Third, the metal frame and the driving module are electrically connected through the main FPC or the backlight FPC, and so the second force touch-touch signal may be transmitted to the metal frame. The transmission structure is simple, and easy for implementation, and the transmission structure has a high reliability.

Figure 14:
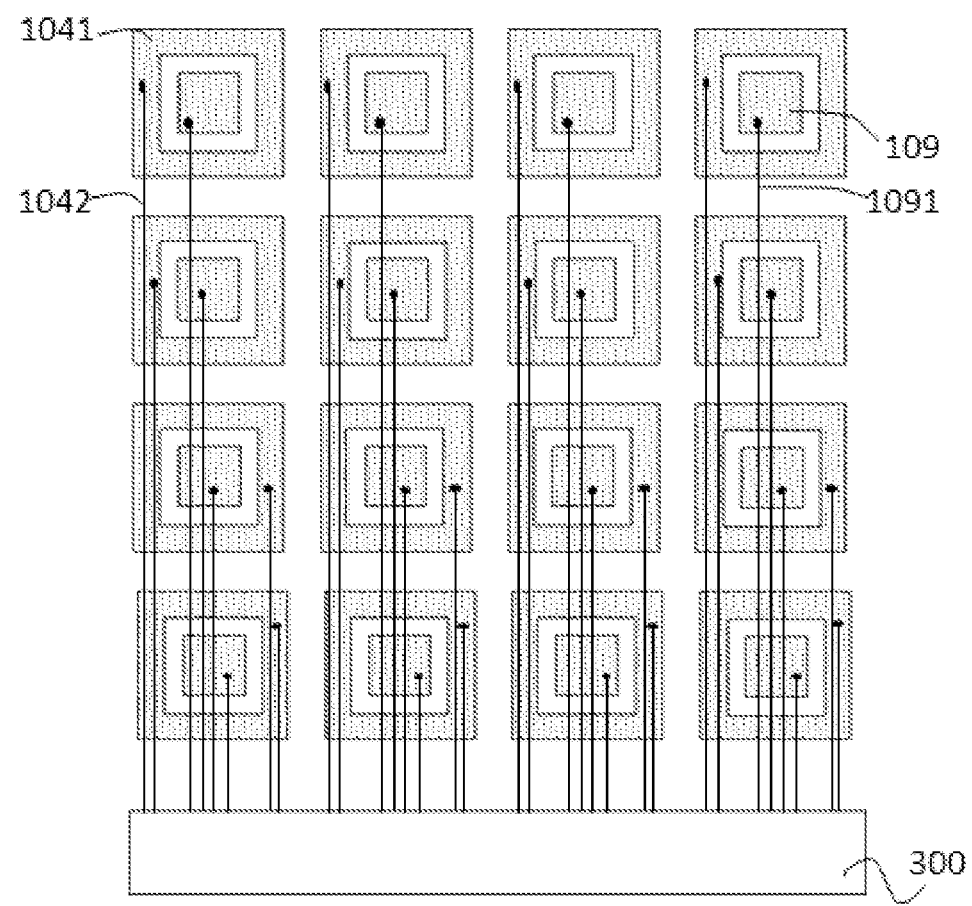
FIG. 14 illustrates a schematic view of an exemplary configuration of first force touch-control components and self-capacitance type touch-control electrodes, consistent with the disclosed embodiments.

FIGS. 14-18 illustrate another exemplary touch-control display device. FIG. 14 illustrates an exemplary configuration of first force touch-control components and self-capacitance type touch-control electrodes. FIGS. 15-18 illustrate three other exemplary configurations of first force touch-control components and self-capacitance type touch-control electrodes.

In the configuration shown in FIG. 14, the first electrodes 1041 are hollow electrodes, and the second electrodes 109 are disposed in the hollow portions of the first electrodes 1041. There are engraved seams at the spacing between a first electrode 1041 and a second electrode 109, making the first electrode 1041 and the second electrode 109 be insulated from each other.

Figure 15:
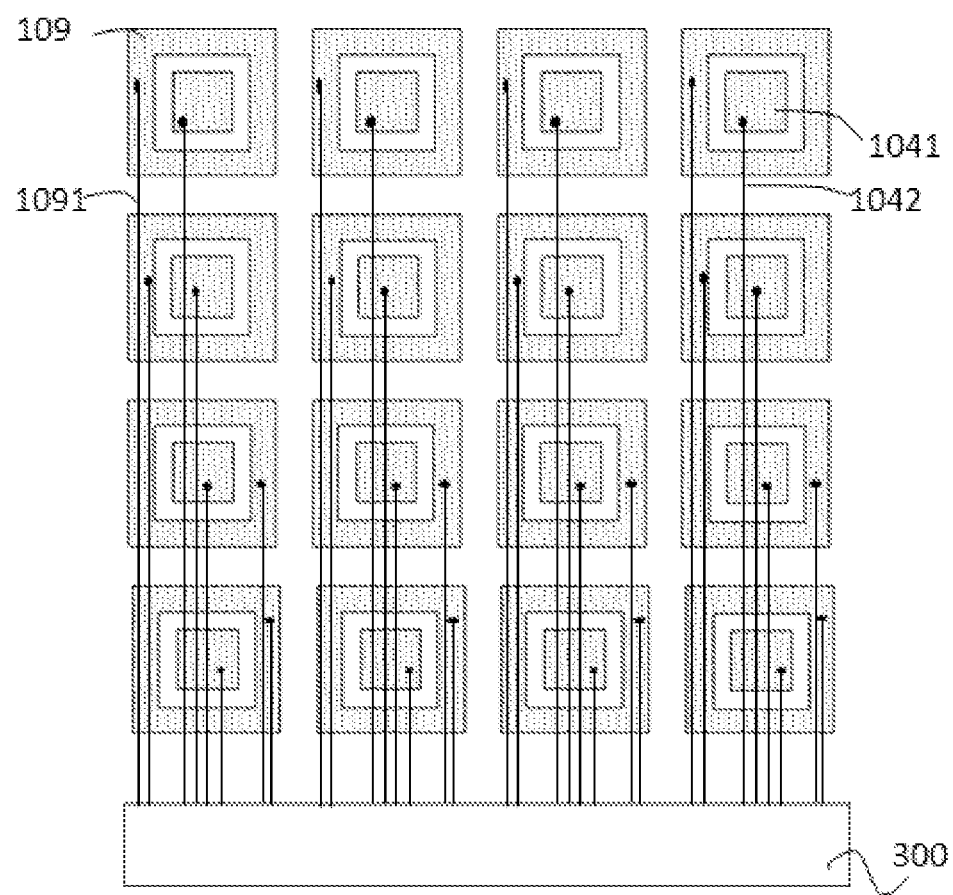
FIG. 15 illustrates a schematic view of another exemplary configuration of first force touch-control components and self-capacitance type touch-control electrodes, consistent with the disclosed embodiments.

FIG. 15 illustrates another exemplary configuration of first force touch-control components and self-capacitance type touch-control electrodes. The second electrodes 109 are hollow electrodes, and the first electrodes 1041 are disposed in the hollow portions of the first electrodes 1041. There are engraved seams at the spacing between a first electrode 1041 and a second electrode 109, making the first electrode 1041 and the second electrode 109 insulated from each other.

In the two configurations shown in FIG. 14 and FIG. 15, respectively, either the first electrodes or the second electrodes are set to be hollow electrodes, and the other electrodes are disposed inside the hollow electrodes. In this way, both the first electrodes and the second electrodes may be uniformly distributed, and there is no blind touch-control area in the entire touch-control side of the display panel.

Further, in the two configurations shown in FIG. 14 and FIG. 15 respectively, the sizes of the first electrodes and the second electrodes may be conveniently designed according to actual requirements. For example, in the configuration shown in FIG. 14, the second electrodes 109 have a small area, and are disposed at the centers of the hollow first electrodes 1041. In the configuration shown in FIG. 15, the first electrodes 1041 have a small area, and are disposed inside the hollow second electrodes 109. The sizes of the first electrodes and the second electrodes may be designed according to actual requirements. However, the overall footprint and position of a set of first and second electrodes may keep unchanged, reducing the design difficulty and variables.

In the two configurations shown in FIG. 14 and FIG. 15 respectively, small electrodes are disposed at the centers of large electrodes. However, FIG. 14 and FIG. 15 do not limit the scope of the present invention. The hollow portion of a large electrode may be not located at the center of the large electrode. The hollow portion of a large electrode may shift to one side or one corner of the large electrode, and a small electrode is correspondingly disposed within the hollow portion of the large electrode.

Figure 16:
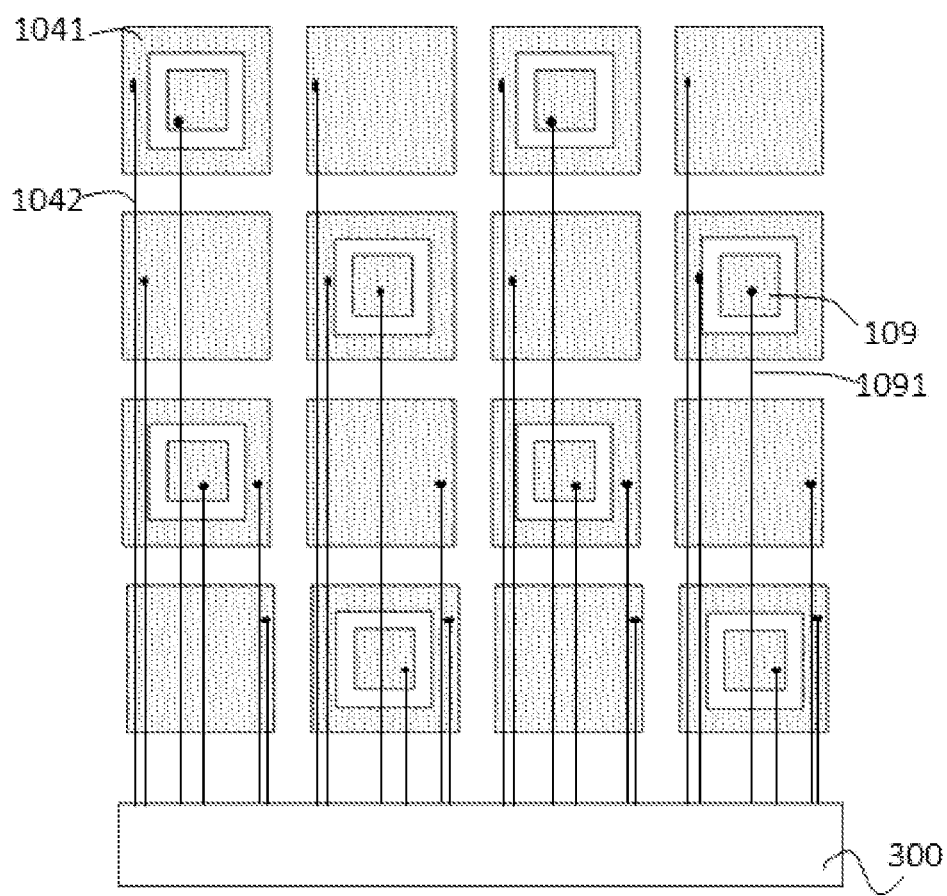
FIG. 16 illustrates a schematic view of another exemplary configuration of first force touch-control components and self-capacitance type touch-control electrodes, consistent with the disclosed embodiments.

FIG. 16 illustrates another exemplary configuration of first force touch-control components and self-capacitance type touch-control electrodes. As shown in FIG. 16, at least certain number of first electrodes 1041 are hollow electrodes, and the other first electrodes 1041 are block-shaped electrodes. The second electrodes 109 are disposed within the hollow portions of the hollow first electrodes 1041. There are engraved seams in the spacing between a hollow first electrode 1041 and a second electrode 109 disposed within the hollow first electrode 1041. That is, distribution densities of the first electrodes 1041 and the second electrodes 109 may be different.

In some other configurations, at least certain number of second electrodes 109 are hollow electrodes, and the other second electrodes 109 are block-shaped electrodes. The first electrodes 1041 are disposed within the hollow portions of the hollow second electrodes 109. There are engraved seams in the spacing between a hollow second electrode 109 and a first electrode 1041 disposed within the hollow second electrode 109.

Figure 17:
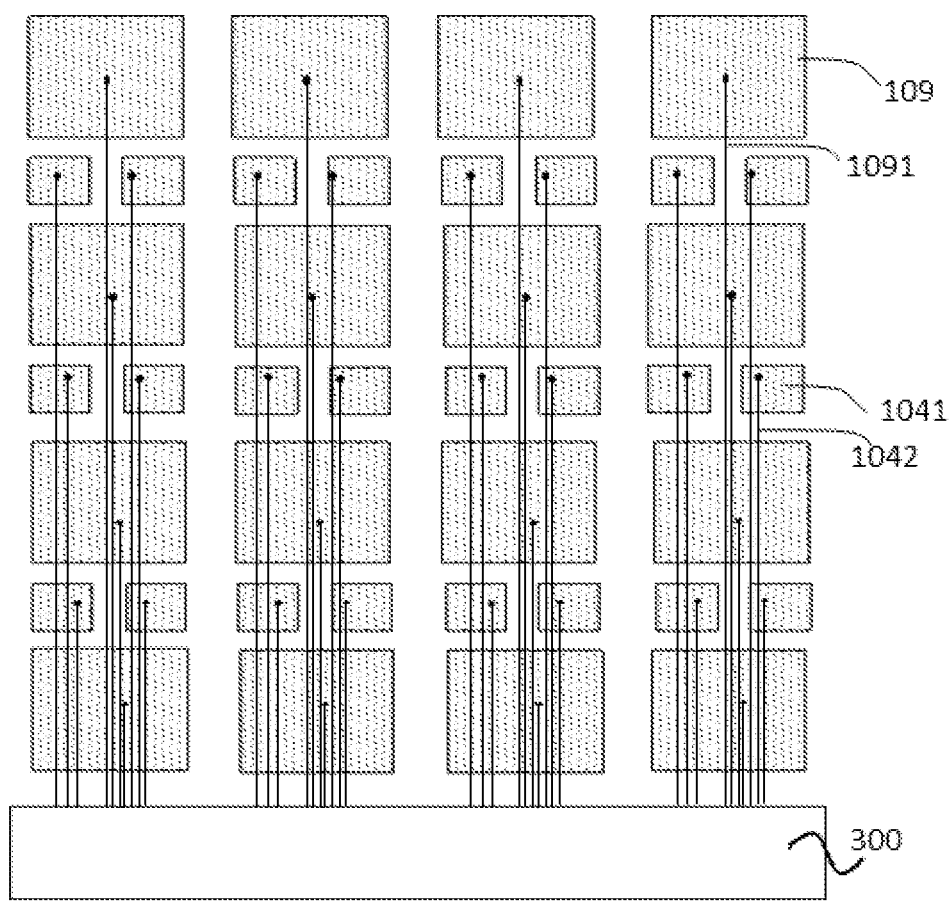
FIG. 17 illustrates a schematic view of another exemplary configuration of first force touch-control components and self-capacitance type touch-control electrodes, consistent with the disclosed embodiments.

FIG. 17 illustrates another exemplary configuration of first force touch-control components and self-capacitance type touch-control electrodes. The plurality of second electrodes 109 of the self-capacitance type touch-control electrodes are large electrodes, and arranged in a matrix. There is a gap between adjacent second electrodes 109, and multiple first electrodes 1041 may be disposed in the gap between the adjacent second electrodes 109. The resulting structure shown in FIG. 17 has a uniform distribution, and thus the generation of blind touch-control areas may be avoided.

Figure 18:
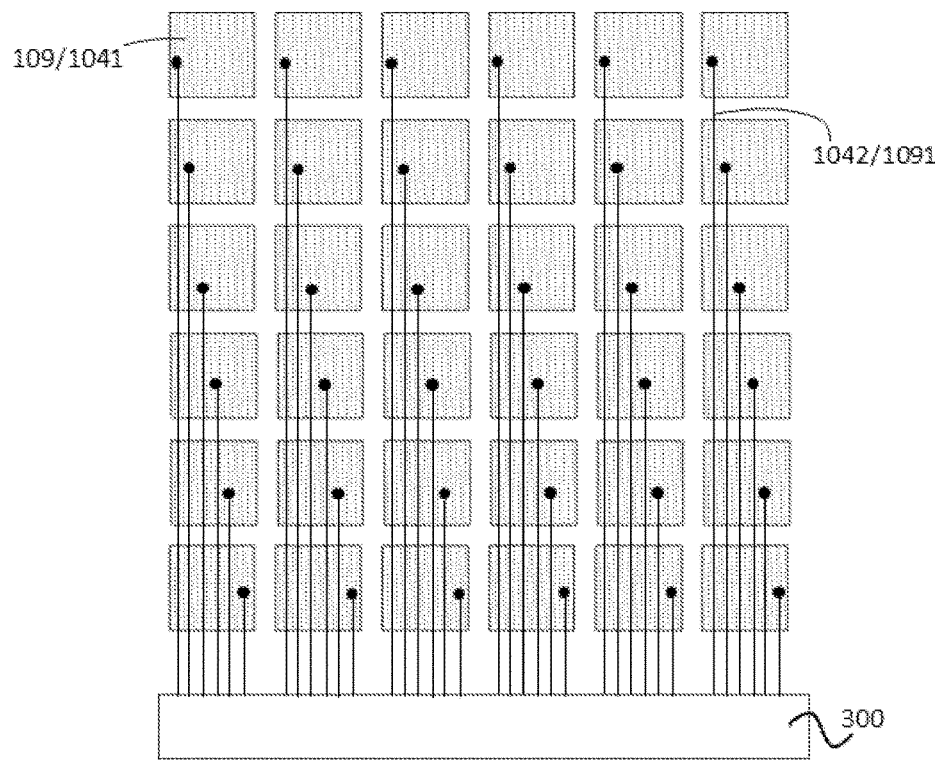
FIG. 18 illustrates a schematic view of another exemplary configuration of first force touch-control components and self-capacitance type touch-control electrodes, consistent with the disclosed embodiments.

FIG. 18 illustrates another exemplary configuration of first force touch-control components and self-capacitance type touch-control electrodes. In the structure shown in FIG. 18, each of the first electrodes 1041 and each of the second electrodes 109 are a same electrode, and each of the first conducting wires 1042 and each of the second conducting wires 1091 are a same conducting wire. That is, the first force touch-control components and the self-capacitance type touch-control electrodes are reusable or multiplexed electrodes. In a touch-control detection stage, the driving module 300 provides a touch-control detection signal to the plurality of multiplexed electrodes 109/1041. In a force detection stage, the driving module 300 provides a first force detection signal to the plurality of multiplexed electrodes 109/1041, and provides a second force detection signal to the second force touch-control component 205.

The present embodiment provides multiple exemplary configurations of first force touch-control components and self-capacitance type touch-control electrodes. These exemplary configurations do not limit the scope of the present invention. It is within the protection scope of the present application as long as a plurality of first electrodes of first force touch-control components and a plurality of second electrodes of self-capacitance type touch-control electrodes are disposed in a same layer.

Figure 19:
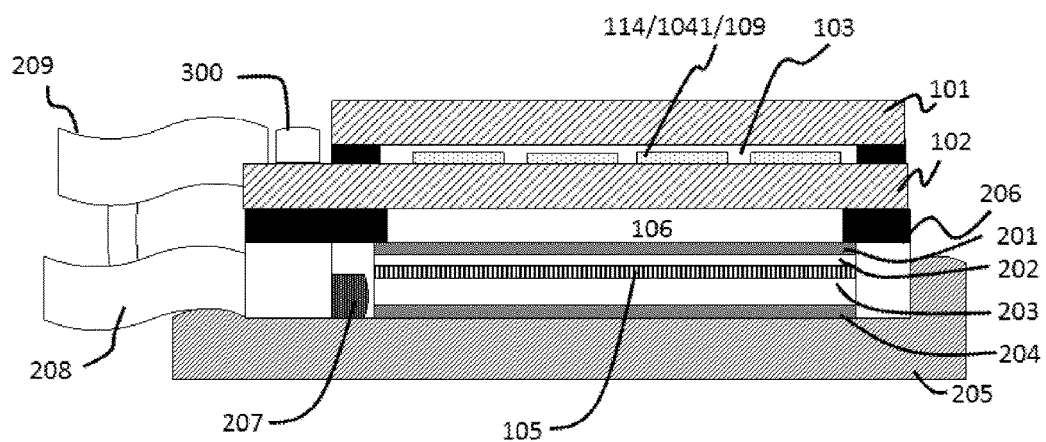
FIG. 19 illustrates a schematic view of another exemplary touch-control display device consistent with the disclosed embodiments.
Figure 20:
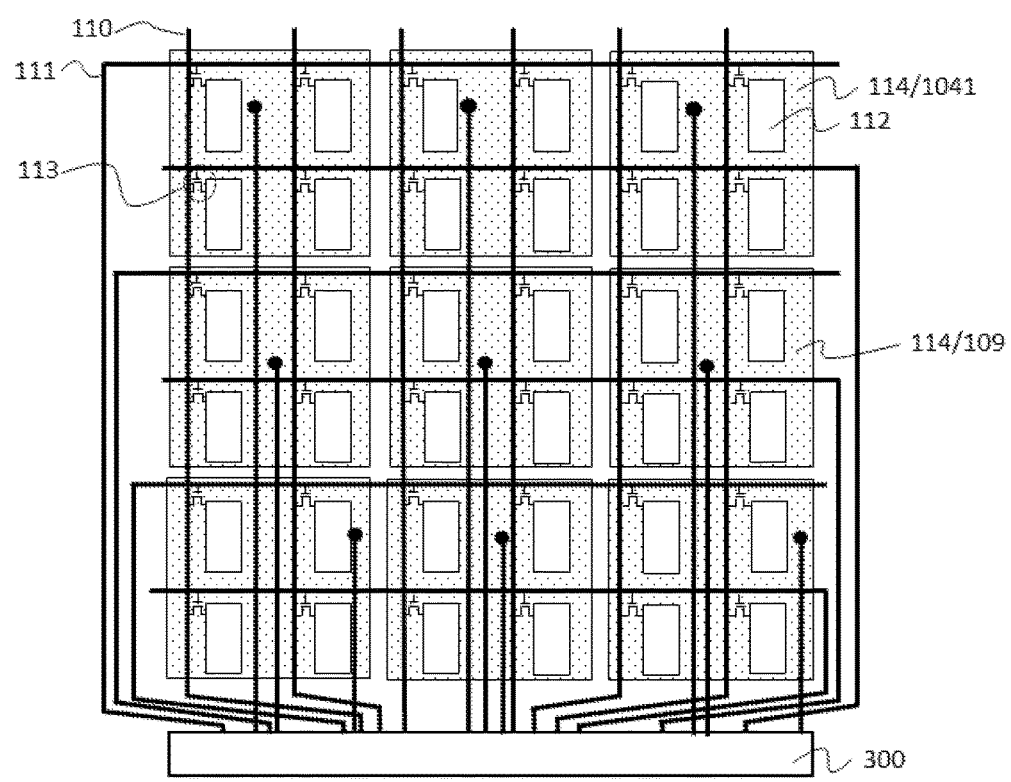
FIG. 20 illustrates a top view of an exemplary array substrate of a touch-control device consistent with the disclosed embodiments.
Figure 21:
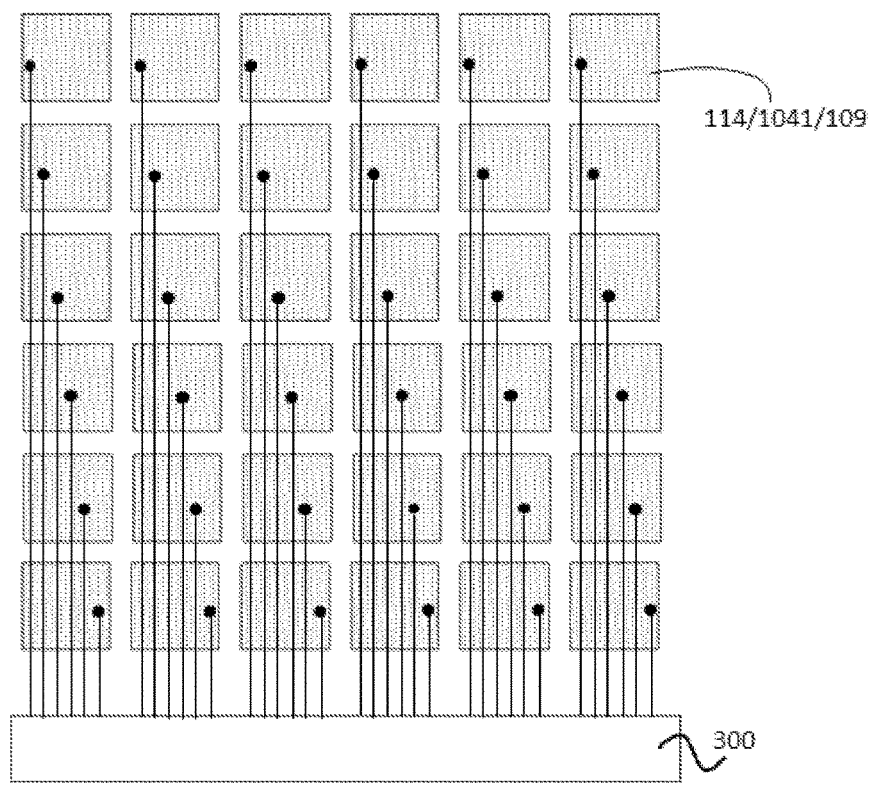
FIG. 21 illustrates a top view of another exemplary array substrate of a touch-control device consistent with the disclosed embodiments.

FIGS. 19-21 illustrate another exemplary touch-control display device. FIG. 19 illustrates the exemplary touch-control display device. FIG. 20 illustrates a top view of an exemplary array substrate of the touch-control display device. FIG. 21 illustrates a top view of another exemplary array substrate of the touch-control display device.

As shown in FIG. 19 and FIG. 20, the exemplary touch-control display device comprises a display panel 100 and a backlight module 200 disposed below the display panel 100. The display panel 100 comprises a counter substrate 101 and an array substrate 102 that are oppositely disposed, and a liquid crystal layer 103 between the counter substrate 101 and the array substrate 102.

The display panel 100 may be an in-plane field liquid crystal display device, comprising a plurality of data lines 110 and scanning lines 111 disposed on the array substrate 102. The plurality of data lines 110 and scanning lines 111 intersect in an insulated way, and the intersecting of the plurality of data lines 110 and scanning lines 111 defines a plurality of pixel units. Each pixel unit comprises a pixel electrode 112 and a switch control component 113. The display panel 100 further comprises a plurality of common electrodes 114 disposed on the array substrate 102. The plurality of common electrodes 114 are arranged in a matrix, and spaced from each other.

The touch-control display device further comprises a first force touch-control component 104 and a second force touch-control component 105. The first force touch-control component comprises a plurality of first electrodes 1041 arranged in a matrix. The plurality of first electrodes 1041 are connected to a driving module 300 respectively through their corresponding first conducting wires. The second force touch-control component 105 is an electrical conductive layer within the backlight module 200. A variable gap 106 is formed between the first force touch-control component 104 and the second force touch-control component 105.

The display panel also comprises self-capacitance type touch-control electrodes. A self-capacitance type touch-control electrode comprises a plurality of second electrodes 109 arranged in a matrix. The plurality of second electrodes 109 are connected to the driving module 300 through their corresponding second conducting wires respectively. The plurality of first electrodes 1041 of a first force touch-control component 104, the plurality of second electrodes 109 of a self-capacitance type touch-control electrode, and the common electrodes 114 are disposed in a same layer.

Specifically, as shown in FIG. 20, a certain number of the common electrodes 114 may also operate as first electrodes 1041, and a certain number of the common electrodes 114 may also operate as second electrode 109. In a display stage, the driving module 300 applies a common electrode signal to the plurality of common electrodes 114 to make the touch-control display device display images. In the force detection stage, the driving module 300 applies a first force detection signal to the plurality of common electrodes 114 operating as first electrodes 1041, and concurrently applies a second force detection signal to the second force touch-control component, for detecting whether there is a pressure force applied on a first electrode 1041, and determining the magnitude of the pressure force. In a touch-control detection stage, the driving module 300 provides a touch-control detection signal to a plurality of common electrodes 114 operating as second electrodes 109, for detecting the location of the touch-control occurrence.

FIG. 21 illustrates another exemplary array substrate of a touch-control device. As shown in FIG. 21, a plurality of electrodes 114/1041/109 are disposed at a same layer. Each of the electrodes 114/1041/109 is a reusable or multiplexed electrode. That is, each of the electrodes 114/1041/109 may operate as a common electrode 114, a first electrode 1041 of a first force touch-control component 104, and a second electrode 109 of a self-capacitance type touch-control electrode.

In the display stage, the driving module 300 applies a common electrode signal to the plurality of electrodes 114/1041/109, making the touch-control display device to display images. In the force detection stage, the driving module 300 applies a first force detection signal to the plurality of electrodes 114/1041/109, and concurrently applies a second force detection signal to the second force touch-control component, for detecting whether there is a pressure force applied, and determining the magnitude of the pressure force. In the touch-control detection stage, the driving module 300 provides a touch-control detection signal to the plurality of electrodes 114/1041/109, for detecting the location of the touch-control occurrence.

In the configuration shown in FIG. 19, the second force touch-control component 105 is an independent conductive film layer, and is disposed on the side of the light guide plate 203 facing the display panel 100. In some other configurations, the second force touch-control component 105 may be disposed on the side of a brightness enhancement sheet 201, a diffusion sheet 202, a light guide plate 203, a reflection sheet 204, or a metal frame 205, facing the display panel 100. The second force touch-control component 105 may also be disposed on the side of a brightness enhancement sheet 201, a diffusion sheet 202, a light guide plate 203, a reflective sheet 204, or a metal frame 205, away from the display panel 100.

In the disclosed touch-control display devices, the first force touch-control components, the self-capacitance type touch-control electrodes, and the common electrodes are integrated in a same layer. The display devices have a high integration, and are light and thin. Further, because the first force touch-control components, the self-capacitance type touch-control electrodes, and the common electrodes are integrated in a same layer, they may be formed in a same process step, and no additional process steps are needed, saving the fabricating costs.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A touch-control display device, comprising:
a driving circuit;
a display panel having a first force touch-control component and a self-capacitance type touch-control electrode; and
a backlight module disposed opposing the display panel and having a second force touch-control component, with a variable gap formed between the first force touch-control component and the second force touch-control component;
wherein:
the first force touch-control component comprises a plurality of first electrodes arranged in a matrix;
the second force touch-control component is an electrical conductive layer; and
the self-capacitance type touch-control electrode comprises a plurality of second electrodes arranged in a matrix;
the backlight module further comprises a plastic frame, a light guide plate disposed inside the plastic frame, a light source disposed at a light-entering side of the light guide plate, a metal frame carrying the plastic frame and the light guide plate, a main flexible printed circuit (FPC) and a backlight FPC, wherein the metal frame is disposed on one side of the backlight module away from the display panel,
wherein:
the backlight FPC comprises a first connecting terminal, a second connecting terminal different from the first connecting terminal, and an electrical conductive end disposed on the second connecting terminal,
the backlight FPC is electrically connected to the main FPC through a pin of the first connecting terminal of the backlight FPC, and the main FPC is electrically connected to the driving circuit,
the second connecting terminal of the backlight FPC is protruded outwardly of the metal frame to be folded to a side of the metal frame away from the display panel,
the electrical conductive end disposed on the second connecting terminal of the backlight FPC is electrically connected to the metal frame through a conductive adhesive layer disposed on the side of the metal frame away from the display panel, and
a light-shading tape is disposed at edges between the display panel and the backlight module to form a gap, and the gap includes the variable gap formed between the first force touch-control component and the second force touch-control component.

2. The touch-control display device according to claim 1, wherein:
the plurality of first electrodes are connected to the driving circuit respectively through corresponding first conducting wires;

the plurality of second electrodes are connected to the driving circuit respectively through corresponding second conducting wires; and the plurality of first electrodes of the first force touch-control component and the plurality of second electrodes of the self-capacitive type touch-control electrode are disposed on a same layer.

3. The touch-control display device according to claim 1, wherein:

the display panel is a liquid crystal display panel having a counter substrate and an array substrate;

a liquid crystal layer is disposed between the counter substrate and the array substrate; and the first force touch-control component and the self-capacitance type touch control electrode are disposed between the counter substrate and the array substrate.

4. The touch-control display device according to claim 3, wherein the first force touch-control component and the self-capacitance type touch control electrode are disposed at a side of the array substrate facing the counter substrate.

5. The touch-control display device according to claim 3, further comprising:

common electrodes disposed between the counter substrate and the array substrate, wherein:

the first force touch-control component, the common electrodes, and the self-capacitance type touch-control electrode are disposed in a same layer;

at least a part of the common electrodes are multiplexed as first force touch-control components; and at least a part of the common electrodes are multiplexed as self-capacitance type touch-control electrodes.

6. The touch-control display device according to claim 5, wherein:

in a display stage, the driving circuit is further for applying a common electrode signal to the common electrodes, and the second force touch-control component is set to a floating state;

in a force detection stage, the driving circuit is further for applying a first force detection signal to the common electrodes operating as first force touch-control components, and concurrently applying a second force detection signal to the second force touch-control component; and in a touch-control detection stage, the driving circuit is further for providing a touch-control detection signal to the common electrodes operating as the self-capacitance type touch-control electrodes, and the second force touch-control component is set to the floating state.

7. The touch-control display device according to claim 1, wherein:

in a touch-control detection stage, the driving circuit is further for providing a touch-control detection signal to the plurality of first electrodes; and in a force detection stage, the driving circuit is further for providing a first force detection signal to the plurality of first electrodes, and providing a second force detection signal to the second force touch-control component.

8. The touch-control display device according to claim 1, wherein at least certain number of first electrodes are hollow electrodes, and the second electrodes are disposed within the hollow portions of the hollow first electrodes, and engraved seams are formed in spacing between the hollow first electrodes and the second electrodes.

9. The touch-control display device according to claim 1, wherein at least certain number of second electrodes are hollow electrodes, and the first electrodes are disposed within the hollow portions of the hollow second electrodes, and engraved seams are formed in spacing between the hollow second electrodes and the first electrodes.

10. The touch-control display device according to claim 1, wherein each of the first electrodes and each of the second electrodes are a same electrode, and each of first conducting wires and each of second conducting wires are a same conducting wire.

11. The touch-control display device according to claim 10, wherein:

in a touch-control detection stage, the driving circuit is further for providing a touch-control detection signal to the plurality of first electrodes and the plurality of second electrodes, and the second force touch-control component is set to a floating state; and in a force detection stage, the driving circuit is further for providing a first force detection signal to the plurality of first electrodes and the plurality of second electrodes, and providing a second force detection signal to the second force touch-control component.

12. The touch-control display device according to claim 1, wherein the electrical conductive layer is the metal frame.

13. The touch-control display device according to claim 1, wherein the gap formed by the display panel, the backlight module, and the light-shading tape is the variable gap.

14. The touch-control display device according to claim 13, wherein a thickness of the light-shading tape is in the range between 0.05 mm to 0.2 mm.

15. A touch-control display device, comprising:

a driving circuit;

a display panel having a first force touch-control component and a self-capacitance type touch-control electrode; and a backlight module disposed opposing the display panel and having a second force touch-control component, with a variable gap formed between the first force touch-control component and the second force touch-control component;

wherein:

the first force touch-control component comprises a plurality of first electrodes arranged in a matrix;

the second force touch-control component is an electrical conductive layer; and the self-capacitance type touch-control electrode comprises a plurality of second electrodes arranged in a matrix;

the backlight module further comprises a plastic frame, a light guide plate disposed inside the plastic frame, a light source disposed at a light-entering side of the light guide plate, a metal frame carrying the plastic frame and the light guide plate, a main flexible printed circuit (FPC) and a backlight FPC, wherein the metal frame is disposed on one side of the backlight module away from the display panel, wherein:

the backlight FPC comprises a first connecting terminal, a second connecting terminal different from the first connecting terminal, and an electrical conductive end disposed on the second connecting terminal, the backlight FPC is electrically connected to the main FPC through a pin of the first connecting terminal of the backlight FPC, and the main FPC is electrically connected to the driving circuit, the second connecting terminal of the backlight FPC is protruded outwardly of the metal frame to be folded to a side of the metal frame away from the display panel, the electrical conductive end disposed on the second connecting terminal of the backlight FPC is electrically connected to the metal frame through a conductive adhesive layer, and wherein an orthogonal projection of the display panel on the metal frame covers the conductive adhesive layer.

\* \* \* \* \*